(12) United States Patent
Pagaila et al.

(10) Patent No.: US 8,866,294 B2
(45) Date of Patent: Oct. 21, 2014

(54) SEMICONDUCTOR DEVICE AND METHOD OF EMBEDDING BUMPS FORMED ON SEMICONDUCTOR DIE INTO PENETRABLE ADHESIVE LAYER TO REDUCE DIE SHIFTING DURING ENCAPSULATION

(75) Inventors: Reza A. Pagaila, Singapore (SG); Yaojian Lin, Singapore (SG); Jun Mo Koo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/536,177

(22) Filed: Jun. 28, 2012

(65) Prior Publication Data

US 2012/0261818 A1 Oct. 18, 2012

Related U.S. Application Data

(62) Division of application No. 12/779,781, filed on May 13, 2010, now Pat. No. 8,241,964.

(51) Int. Cl.
*H01L 23/36* (2006.01)

(52) U.S. Cl.
USPC ............ 257/737; 257/E23.068; 257/E21.502; 257/E21.499; 257/E23.101

(58) Field of Classification Search
USPC ........... 257/737, E23.068, E21.502, E21.499, 257/E23.101
See application file for complete search history.

(56) References Cited

U.S. PATENT DOCUMENTS

| | | | |
|---|---|---|---|
| 5,161,090 A | 11/1992 | Crawford et al. | |
| 5,250,843 A | 10/1993 | Eichelberger | |
| 5,353,498 A | 10/1994 | Fillion et al. | |
| 5,619,070 A | 4/1997 | Kozono | |
| 5,841,193 A | 11/1998 | Eichelberger | |
| 6,867,471 B2 | 3/2005 | Goller et al. | |
| 7,517,722 B2 | 4/2009 | Goller et al. | |
| 7,534,660 B2 | 5/2009 | Lee | |
| 7,619,901 B2 | 11/2009 | Eichelberger et al. | |
| 7,666,709 B1 | 2/2010 | Lin et al. | |
| 2001/0052647 A1* | 12/2001 | Plepys et al. ................... 257/738 |
| 2004/0035840 A1 | 2/2004 | Koopmans | |
| 2006/0012038 A1 | 1/2006 | Miyazaki et al. | |
| 2008/0001276 A1* | 1/2008 | Lee et al. ....................... 257/686 |
| 2008/0054460 A1 | 3/2008 | Hung | |
| 2008/0138935 A1* | 6/2008 | Pu et al. ......................... 438/113 |
| 2008/0290496 A1* | 11/2008 | Park .............................. 257/693 |
| 2009/0102048 A1 | 4/2009 | Hori | |
| 2010/0059885 A1 | 3/2010 | Kuan et al. | |

OTHER PUBLICATIONS

Jourdain, Anne et al., "Electrically Yielding Collective Hybrid Bonding for 3D Stacking of ICs", IEEE Electronic Components and Technology Conference, 2009, pp. 11-13.

* cited by examiner

*Primary Examiner* — Marc Armand
(74) *Attorney, Agent, or Firm* — Robert D. Atkins; Patent Law Group: Atkins and Associates, P.C.

(57) ABSTRACT

A semiconductor device has a semiconductor die with a plurality of bumps formed over a surface of the first semiconductor die. A penetrable adhesive layer is formed over a temporary carrier. The adhesive layer can include a plurality of slots. The semiconductor die is mounted to the carrier by embedding the bumps into the penetrable adhesive layer. The semiconductor die and interconnect structure can be separated by a gap. An encapsulant is deposited over the first semiconductor die. The bumps embedded into the penetrable adhesive layer reduce shifting of the first semiconductor die while depositing the encapsulant. The carrier is removed. An interconnect structure is formed over the semiconductor die. The interconnect structure is electrically connected to the bumps. A thermally conductive bump is formed over the semiconductor die, and a heat sink is mounted to the interconnect structure and thermally connected to the thermally conductive bump.

24 Claims, 15 Drawing Sheets

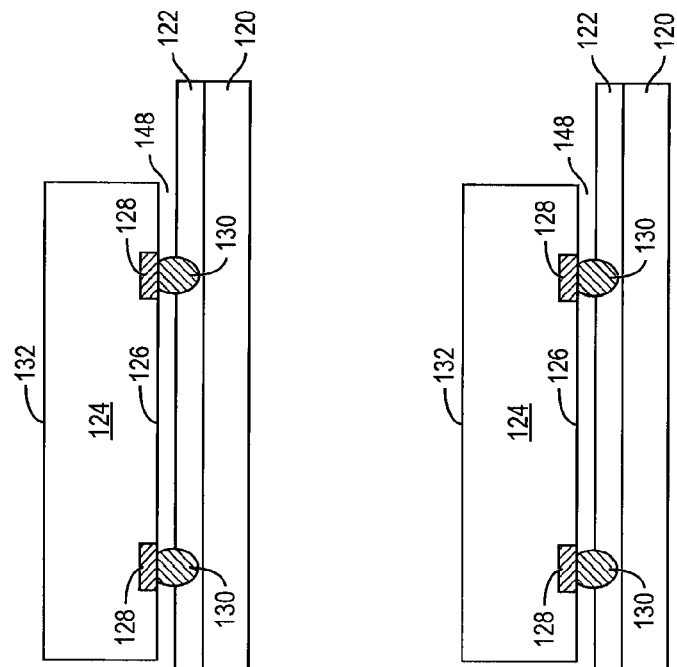
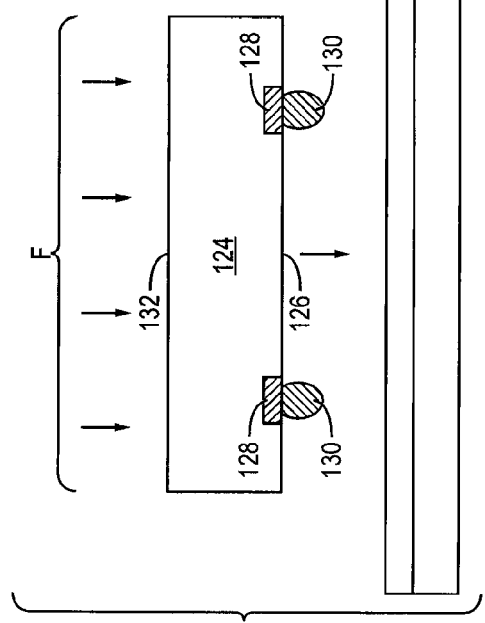
FIG. 5a
FIG. 5b

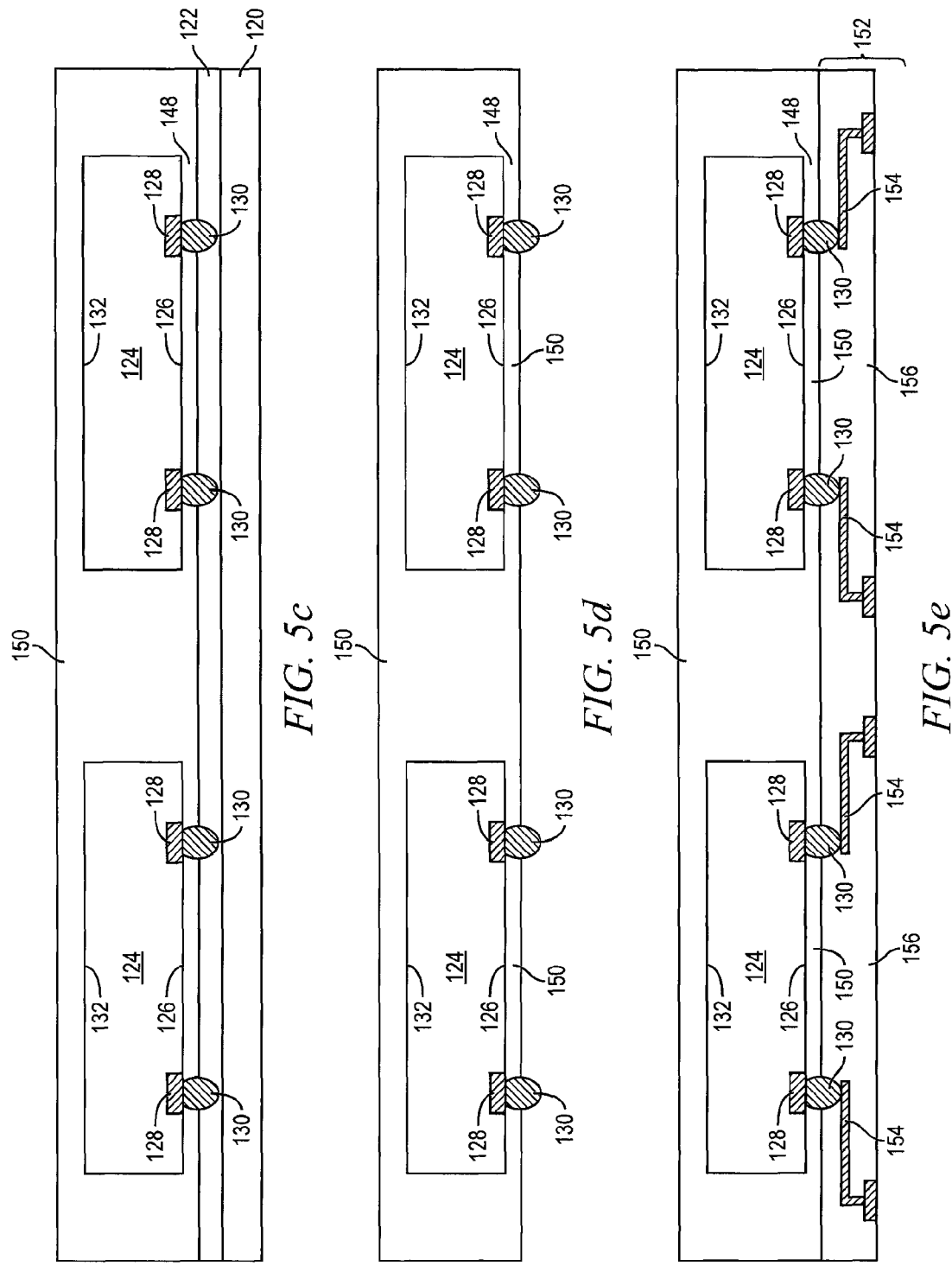

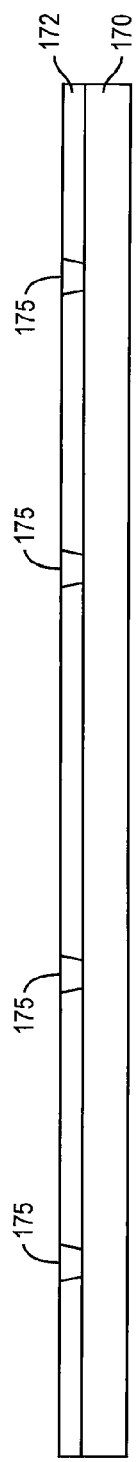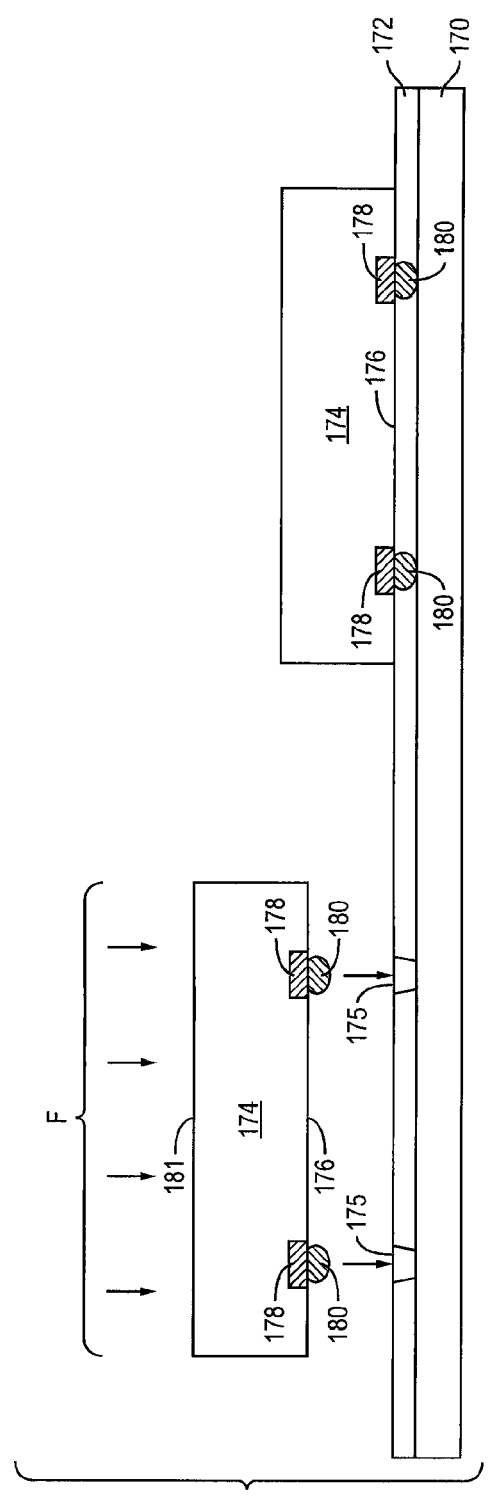

SEMICONDUCTOR DEVICE AND METHOD OF EMBEDDING BUMPS FORMED ON SEMICONDUCTOR DIE INTO PENETRABLE ADHESIVE LAYER TO REDUCE DIE SHIFTING DURING ENCAPSULATION

CLAIM TO DOMESTIC PRIORITY

The present application is a division of U.S. patent application Ser. No. 12/779,781, now U.S. Pat. No. 8,241,964, filed May 13, 2010, which application is incorporated herein by reference.

FIELD OF THE INVENTION

The present invention relates in general to semiconductor devices and, more particularly, to a semiconductor device and method of embedding bumps formed over a semiconductor die into a penetrable adhesive layer to reduce die shifting during encapsulation.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a fan-out wafer level chip scale package (FO-WLCSP), a semiconductor die is commonly mounted to a temporary support carrier with an adhesive layer. An encapsulant or molding compound is deposited over the semiconductor die for environmental protection from external elements and contaminants. The encapsulation process imposes forces on the semiconductor die as the encapsulant is deposited around the die. The adhesive layer over the carrier may be insufficient to hold the semiconductor die in place during encapsulation. The forces can cause vertical or lateral shifting or movement of the semiconductor die.

Following encapsulation, the temporary carrier and adhesive layer are removed and a build-up interconnect structure is formed over the semiconductor die and encapsulant. A plurality of vias must be formed through the insulating layer of the interconnect structure to make electrical connection to the contact pads on the semiconductor die. The vias are formed by mechanical drilling or laser cutting. The via formation often leaves residue and other contaminants on the contact pads, which can interfere with electrical connection and reduce electrical performance.

SUMMARY OF THE INVENTION

A need exists for reducing shifting of a semiconductor die during encapsulation and avoid via formation over the contact pads on the die. Accordingly, in one embodiment, the present invention is a semiconductor device comprising a first semiconductor die including a plurality of bumps formed over a surface of the first semiconductor die. A penetrable adhesive layer is disposed over the first semiconductor die with the bumps at least partially disposed in the penetrable adhesive layer. An encapsulant is deposited over the first semiconductor die. An interconnect structure is formed over the first semiconductor die and electrically connected to the bumps.

In another embodiment, the present invention is a semiconductor device comprising a first semiconductor die including a plurality of first bumps formed over a surface of the first semiconductor die. An adhesive layer is disposed over the first semiconductor die with the first bumps disposed in the adhesive layer. An encapsulant is deposited over the first semiconductor die.

In another embodiment, the present invention is a semiconductor device comprising a first semiconductor die and adhesive layer disposed over the first semiconductor die. An encapsulant is deposited over the first semiconductor die.

In another embodiment, the present invention is a semiconductor device comprising a first semiconductor die including a plurality of bumps formed over a surface of the first semiconductor die. An adhesive layer is disposed over the surface of the first semiconductor die with the bumps at least partially embedded into the adhesive layer to reduce shifting of the first semiconductor die. An encapsulant is deposited over the first semiconductor die.

BRIEF DESCRIPTION OF THE DRAWINGS

FIGS. 5a-5f illustrate a process of embedding bumps into the penetrable adhesive layer with a gap between the semiconductor die and interconnect structure;

FIGS. 7a-7h illustrate a process of embedding bumps in slots formed in an adhesive layer;

DETAILED DESCRIPTION OF THE DRAWINGS

Figure 1:
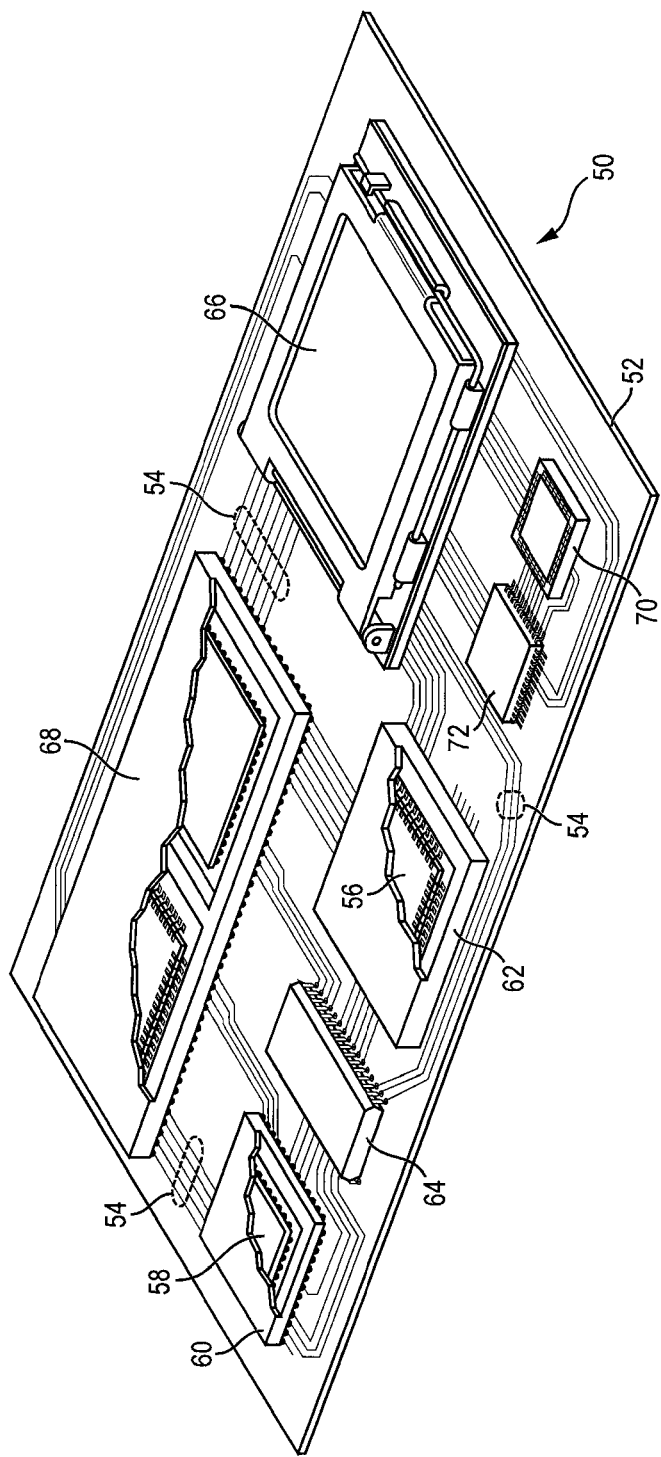
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
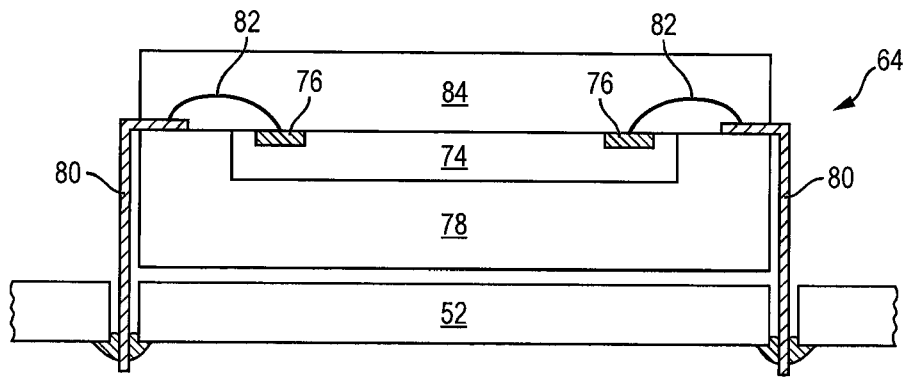
FIGS. 2a-2c illustrate further detail of the representative semiconductor packages mounted to the PCB.
Figure 2B:
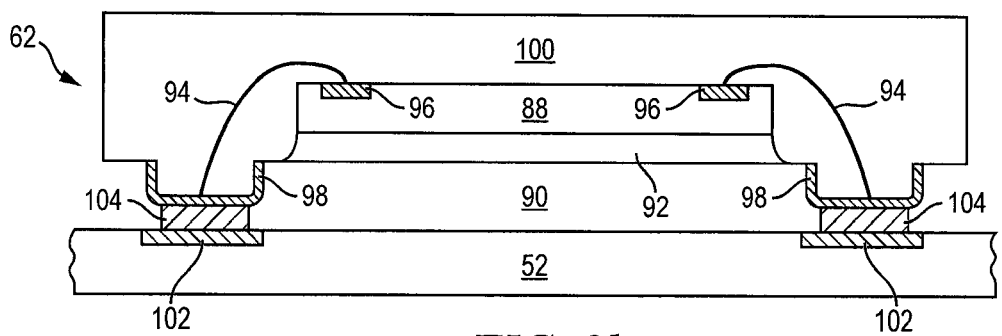
Figure 2C:
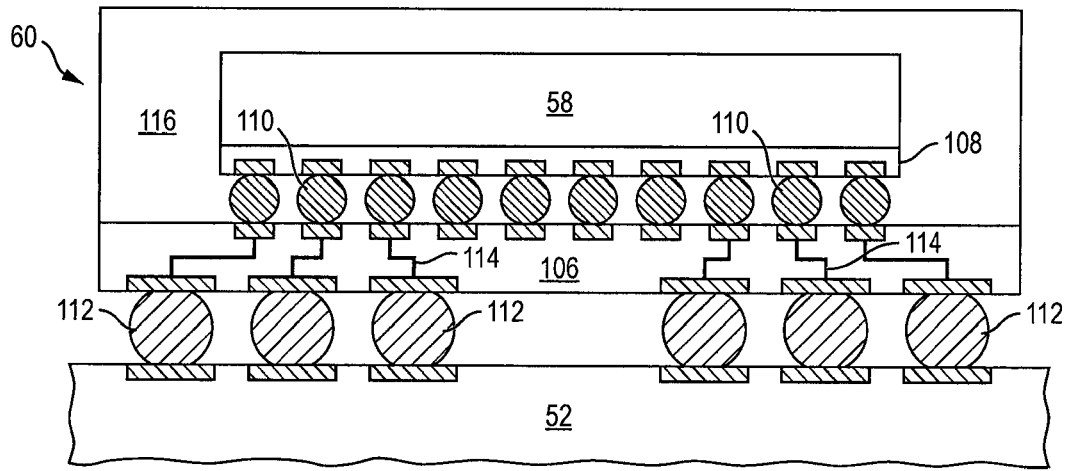

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
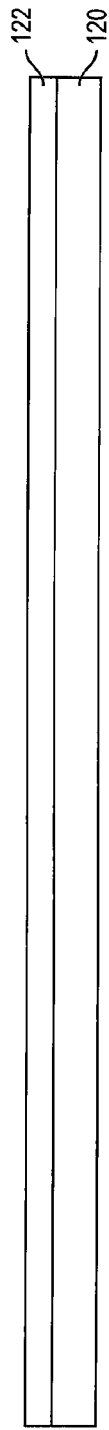
FIGS. 3a-3g illustrate a process of embedding bumps formed over a semiconductor die into a penetrable adhesive layer to reduce die shifting during encapsulation.

FIGS. 3a-3g illustrate, in relation to FIGS. 1 and 2a-2c, a process of embedding bumps formed over a semiconductor die into a penetrable adhesive layer to reduce die shifting during encapsulation. FIG. 3a shows a temporary substrate or carrier 120 containing sacrificial base material such as silicon, polymer, polymer composite, metal, ceramic, glass, glass epoxy, beryllium oxide, or other suitable low-cost, rigid material for structural support. A penetrable adhesive layer or tape 122 is applied over carrier 120. The penetrable adhesive layer 122 can be single or multi-layer polymer, such as b-staged curable epoxy resin, resistant to heat and mechanical stress.

Figure 3B:
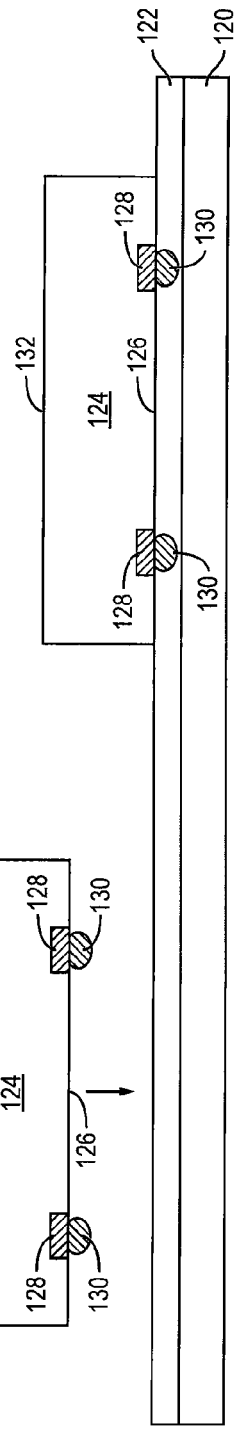

In FIG. 3b, semiconductor die 124 has an active surface 126 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 126 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An electrically conductive layer 128 is formed over active surface 126 using PVD, CVD, electrolytic plating, electroless plating process, or other suitable metal deposition process. Conductive layer 128 can be one or more layers of Al, Cu, Sn, Ni, Au, Ag, or other suitable electrically conductive material. Conductive layer 128 operates as contact pads electrically connected to the circuits on active surface 126.

An electrically conductive bump material is deposited over contact pads 128 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 128 using a suitable attachment or bonding process. In one embodiment, the bump material is reflowed by heating the material above its melting point to form spherical balls or bumps 130. In some applications, bumps 130 are reflowed a second time to improve electrical connection to contact pads 128. The bumps can also be compression bonded to contact pads 128.

Figure 3C:
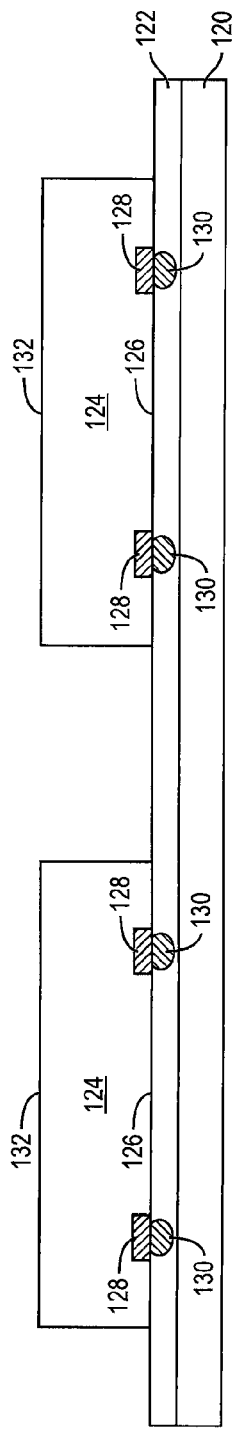

Semiconductor die 124 are mounted to carrier 120 with a force F applied to back surface 132 to cause bumps 130 to penetrate into adhesive layer 122. The force F is removed after active surface 126 comes into close proximity or touches a top surface of interface layer 122. FIG. 3c shows all semiconductor die 124 mounted to carrier 120 with bumps 130 embedded into penetrable adhesive layer 122. Bumps 130 may or may not contact the surface of carrier 120. The penetrable adhesive layer 122 is cured to harden the adhesive layer and securely hold bumps 130.

Figure 3D:
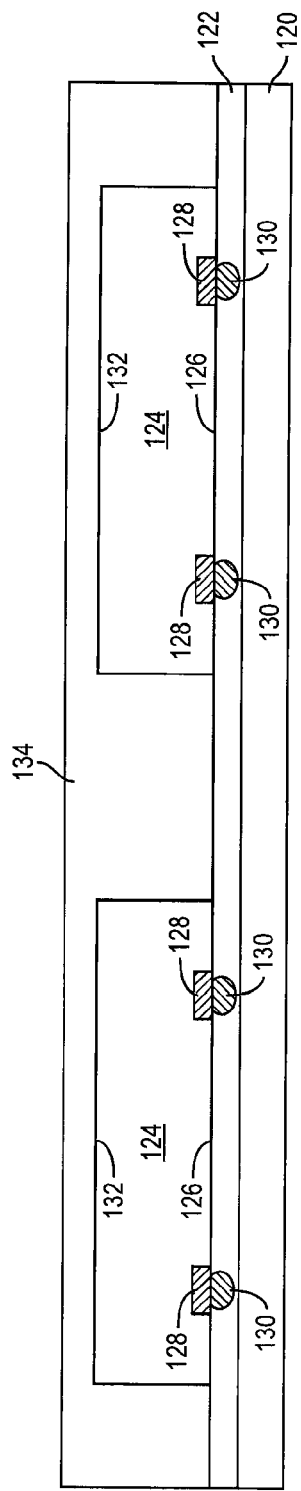

In FIG. 3d, an encapsulant or molding compound 134 is deposited over semiconductor die 124 and carrier 120 using a paste printing, compressive molding, transfer molding, liquid encapsulant molding, vacuum lamination, spin coating, or other suitable applicator. Encapsulant 134 can be polymer composite material, such as epoxy resin with filler, epoxy acrylate with filler, or polymer with proper filler. Encapsulant 134 is non-conductive and environmentally protects the semiconductor device from external elements and contaminants.

With bumps 130 embedded into penetrable adhesive layer 122 and the adhesive layer cured, semiconductor die 124 remain stationary during deposition of encapsulant 134. The embedded bumps 130 hold semiconductor die 124 securely in place, reducing lateral or vertical shifting of the die, while encapsulant 134 is deposited and cured. If the glass transition temperature (Tg) of penetrable adhesive layer 122 is less than the Tg of encapsulant 134, then the adhesive layer can be cured simultaneously with the encapsulant.

Figure 3E:
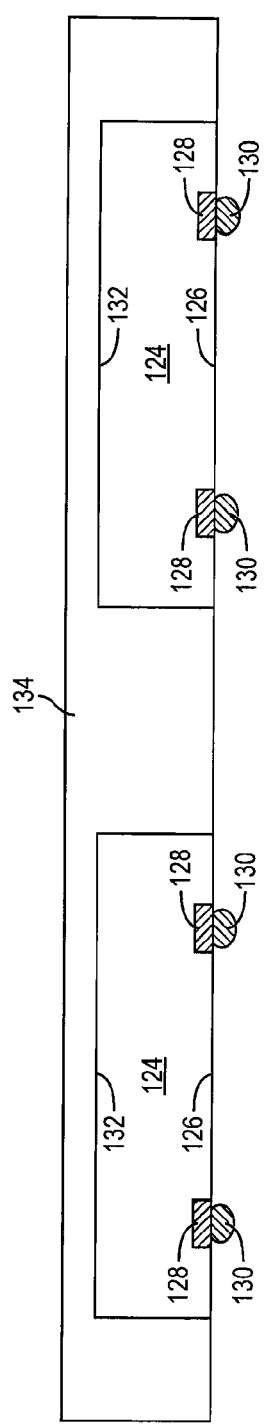

In FIG. 3e, temporary carrier 120 and penetrable adhesive layer 122 are removed by chemical etching, mechanical peel-off, CMP, mechanical grinding, thermal bake, UV light, laser scanning, or wet stripping. Bumps 130 are exposed from contact pads 128.

Figure 3F:
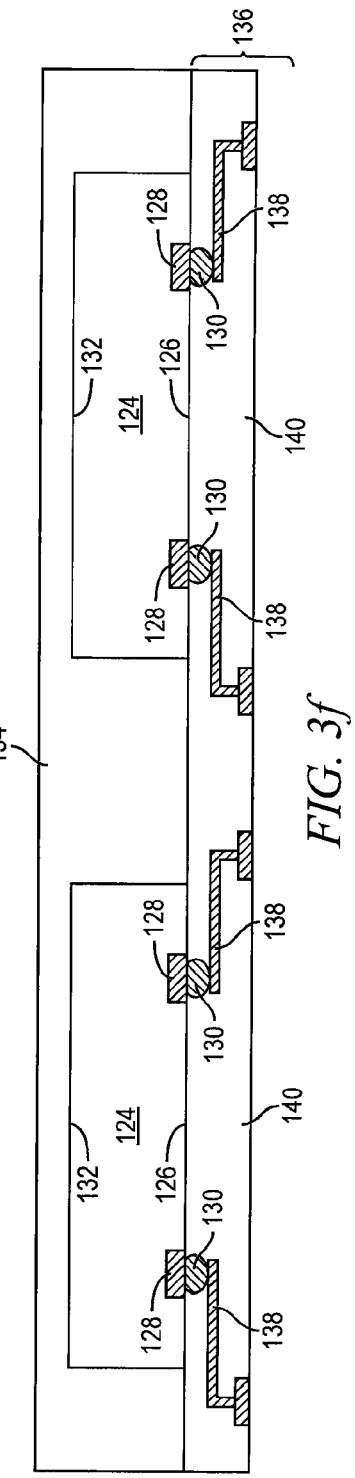

In FIG. 3f, a bottom-side build-up interconnect structure 136 is formed over active surface 126 of semiconductor die 124 and encapsulant 134. The build-up interconnect structure 136 includes an electrically conductive layer 138 formed using a patterning and metal deposition process such as sputtering, electrolytic plating, and electroless plating. Conductive layer 138 can be one or more layers of Al, Cu, Sn, Ni, Au, Ag, or other suitable electrically conductive material. One portion of conductive layer 138 is electrically connected to bumps 130 and contact pads 128 of semiconductor die 124. Other portions of conductive layer 138 can be electrically common or electrically isolated depending on the design and function of the semiconductor device.

The build-up interconnect structure 136 further includes an insulating or passivation layer 140 formed between conductive layers 138 and containing one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 140 is formed using PVD, CVD, printing, spin coating, spray coating, sintering or thermal oxidation. Bumps 130 are embedded within insulating layer 140.

Figure 3G:
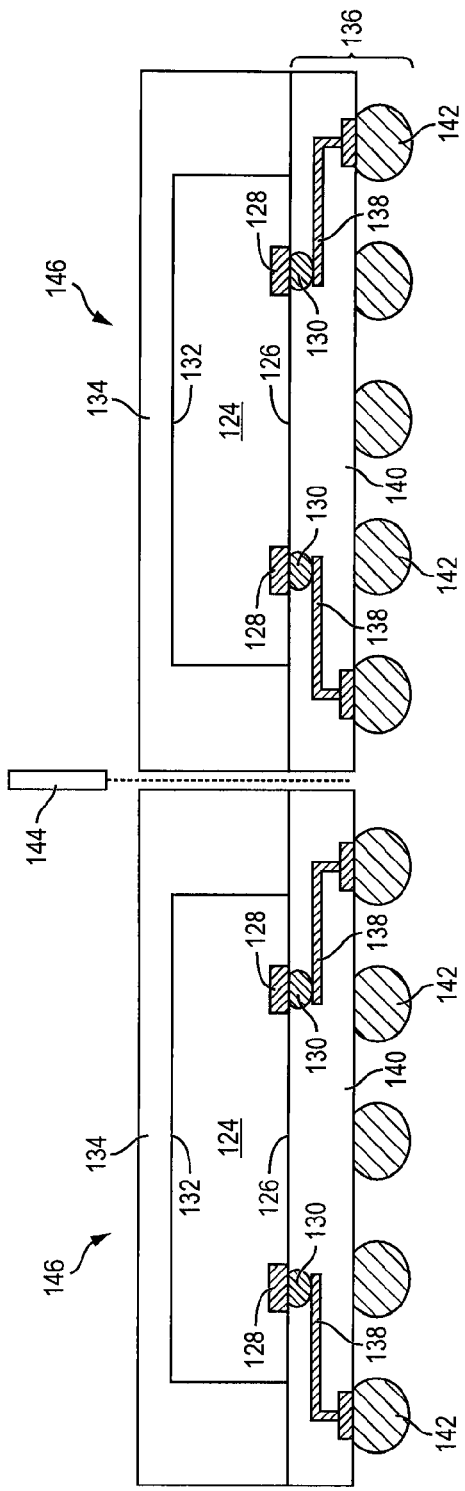

In FIG. 3g, an electrically conductive bump material is deposited over build-up interconnect structure 136 and electrically connected to conductive layer 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 138 using a suitable attachment or bonding process. In one embodiment, the bump material is reflowed by heating the material above its melting point to form spherical balls or bumps 142. In some applications, bumps 142 are reflowed a second time to improve electrical contact to conductive layer 138. The bumps can also be compression bonded to conductive layer 138. Bumps 142 represent one type of interconnect structure that can be formed over conductive layer 138. The interconnect structure can also use bond wires, stud bump, micro bump, or other electrical interconnect.

Semiconductor die 124 are singulated with saw blade or laser cutting tool 144 into individual FO-WLCSP 146.

Figure 4:
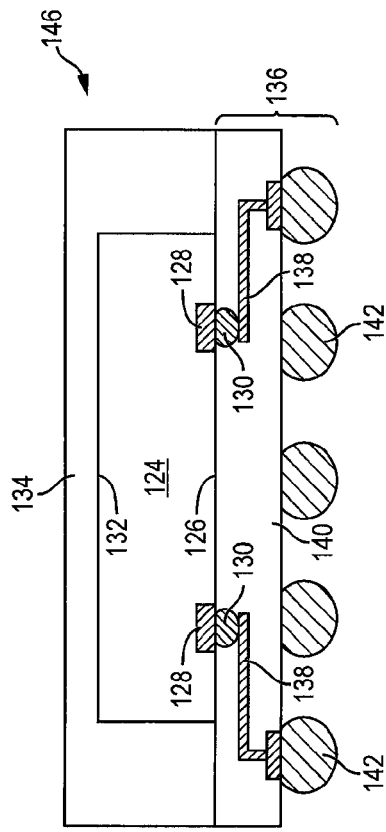
FIG. 4 illustrates the semiconductor die with bumps embedded within the build-up interconnect structure.

FIG. 4 shows FO-WLCSP 146 after singulation. Semiconductor die 124 is electrically connected to build-up interconnect structure 136 and bumps 142. With bumps 130 embedded into penetrable adhesive layer 122, semiconductor die 124 remain securely in place during deposition of encapsulant 134. The embedded bumps 130 hold semiconductor die 124 securely in place, reducing lateral or vertical shifting of the die, while encapsulant 134 is deposited and cured. The embedded bumps 130 also simplify the manufacturing process by eliminating the need to form wettable contact pads or vias in the interconnect structure to expose the contact pads, as described in the background.

In another embodiment, continuing from FIG. 3b, semiconductor die 124 are mounted to carrier 120 with a force F applied to back surface 132 to cause bumps 130 to penetrate into adhesive layer 122. In this case, bumps 130 penetrate adhesive layer 122 to a depth that leaves active surface 126 displaced from the top surface of penetrable adhesive layer 122 by gap 148, as shown in FIG. 5a. FIG. 5b shows all semiconductor die 124 mounted to carrier 120 with bumps 130 embedded into penetrable adhesive layer 122, while leaving gap 148 between active surface 126 and the adhesive layer. Bumps 130 may or may not contact the surface of carrier 120. The penetrable adhesive layer 122 is cured to harden the adhesive layer and securely hold bumps 130.

In FIG. 5c, an encapsulant or molding compound 150 is deposited over semiconductor die 124 and carrier 120 using a paste printing, compressive molding, transfer molding, liquid encapsulant molding, vacuum lamination, spin coating, or other suitable applicator. Encapsulant 150 fills gap 148 between active surface 126 and penetrable adhesive layer 122. Encapsulant 150 can be polymer composite material, such as epoxy resin with filler, epoxy acrylate with filler, or polymer with proper filler. Encapsulant 150 is non-conductive and environmentally protects the semiconductor device from external elements and contaminants.

With bumps 130 embedded into penetrable adhesive layer 122 and the adhesive layer cured, semiconductor die 124 remain stationary during deposition of encapsulant 150. The embedded bumps 130 hold semiconductor die 124 securely in place, reducing lateral or vertical shifting of the die, while encapsulant 150 is deposited and cured. If the Tg of penetrable adhesive layer 122 is less than the Tg of encapsulant 150, then the adhesive layer can be cured simultaneously with the encapsulant.

In FIG. 5d, temporary carrier 120 and penetrable adhesive layer 122 are removed by chemical etching, mechanical peel-off, CMP, mechanical grinding, thermal bake, UV light, laser scanning, or wet stripping. Encapsulant 150 remains covering active surface 126 and to act as a stress relief buffer between semiconductor die 124 and build-up interconnect structure 152. Bumps 130 are exposed from encapsulant 150.

In FIG. 5e, a bottom-side build-up interconnect structure 152 is formed over encapsulant 150. The build-up interconnect structure 152 includes an electrically conductive layer 154 formed using a patterning and metal deposition process such as sputtering, electrolytic plating, and electroless plating. Conductive layer 154 can be one or more layers of Al, Cu, Sn, Ni, Au, Ag, or other suitable electrically conductive material. One portion of conductive layer 154 is electrically connected to bumps 130 and contact pads 128 of semiconductor die 124. Other portions of conductive layer 154 can be electrically common or electrically isolated depending on the design and function of the semiconductor device.

The build-up interconnect structure 152 further includes an insulating or passivation layer 156 formed between conductive layers 154 and containing one or more layers of SiO2, Si3N4, SiON, Ta2O5, Al2O3, or other material having similar insulating and structural properties. The insulating layer 156 is formed using PVD, CVD, printing, spin coating, spray coating, sintering or thermal oxidation. Bumps 130 are partially embedded within insulating layer 156.

Figure 5F:
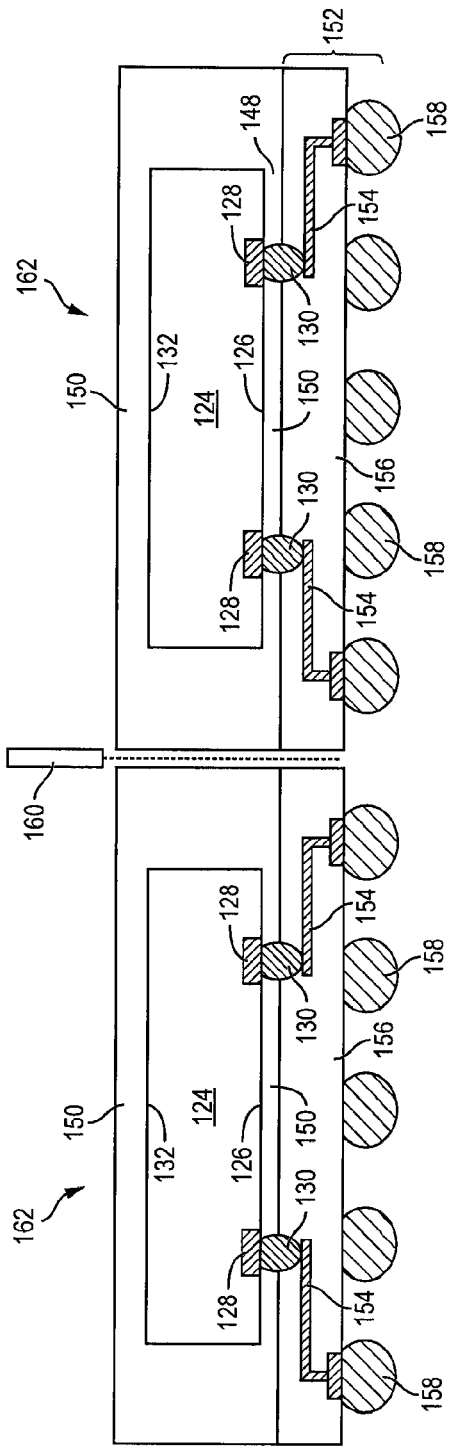

In FIG. 5f, an electrically conductive bump material is deposited over build-up interconnect structure 152 and electrically connected to conductive layer 154 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 154 using a suitable attachment or bonding process. In one embodiment, the bump material is reflowed by heating the material above its melting point to form spherical balls or bumps 158. In some applications, bumps 158 are reflowed a second time to improve electrical contact to conductive layer 154. The bumps can also be compression bonded to conductive layer 154. Bumps 158 represent one type of interconnect structure that can be formed over conductive layer 154. The interconnect structure can also use bond wires, stud bump, micro bump, or other electrical interconnect.

Semiconductor die 124 are singulated with saw blade or laser cutting tool 160 into individual FO-WLCSP 162.

Figure 6:
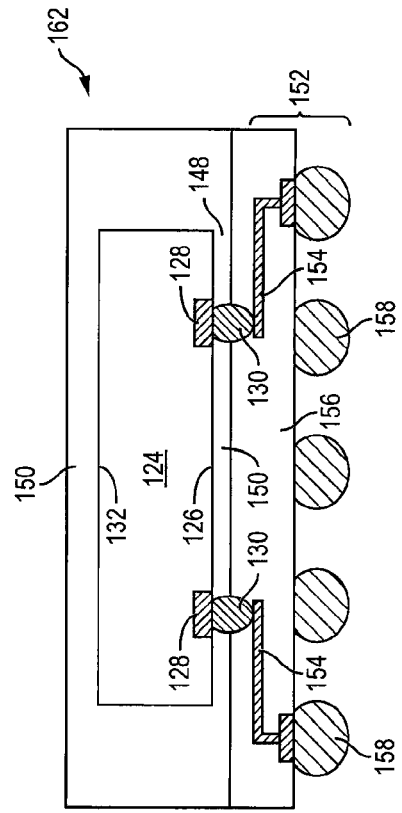
FIG. 6 illustrates the semiconductor die with bumps embedded within the interconnect structure and a gap between the semiconductor die and interconnect structure.

FIG. 6 shows FO-WLCSP 162 after singulation. Semiconductor die 124 is electrically connected to build-up interconnect structure 152 and bumps 158. With bumps 130 embedded into penetrable adhesive layer 122, semiconductor die 124 remain securely in place during deposition of encapsulant 150. The embedded bumps 130 hold semiconductor die 124 securely in place, reducing lateral or vertical shifting of the die, while encapsulant 150 is deposited and cured. The embedded bumps 130 also simplify the manufacturing process by eliminating the need to form wettable contact pads or vias in the interconnect structure to expose contact pads 128, as described in the background. With gap 148 between semiconductor die 124 and penetrable adhesive layer 122, encapsulant 150 covers active surface 126 to provide stress relief between the semiconductor die and build-up interconnect structure.

FIG. 7a shows another embodiment with temporary substrate or carrier 170 containing sacrificial base material such as silicon, polymer, polymer composite, metal, ceramic, glass, glass epoxy, beryllium oxide, or other suitable low-cost, rigid material for structural support. An adhesive layer or tape 172 is applied over carrier 170. Adhesive layer 172 can be single or multi-layer polymer, such as b-staged curable epoxy resin, resistant to heat and mechanical stress.

A plurality of openings or slots 173 is formed in adhesive layer 172 by mechanical drilling, etching, or laser cutting. Slots 173 corresponding to placement of bumps 180 formed on semiconductor die 174 to be mounted to carrier 170 and can operate as alignment marks, avoiding the need for precision bonding equipment. The depth of slots 173 is substantially equal to, or slightly greater or less than, the height of bumps 180, and the width of slots 173 are substantially equal to or slightly less than a width of bumps 180, to form a tight bond between the bumps and adhesive layer 122. An optional patterned paste or glue 175 can be deposited into slots 173 for better adhesion to bumps 180, as shown in FIG. 7b.

In FIG. 7c, semiconductor die 174 has an active surface 176 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 176 to implement analog circuits or digital circuits, such as DSP, ASIC, memory, or other signal processing circuit. Semiconductor die 174 may also contain IPDs, such as inductors, capacitors, and resistors, for RF signal processing.

An electrically conductive layer 178 is formed over active surface 126 using PVD, CVD, electrolytic plating, electroless plating process, or other suitable metal deposition process. Conductive layer 178 can be one or more layers of Al, Cu, Sn, Ni, Au, Ag, or other suitable electrically conductive material. Conductive layer 178 operates as contact pads electrically connected to the circuits on active surface 176.

An electrically conductive bump material is deposited over contact pads 178 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 178 using a suitable attachment or bonding process. In one embodiment, the bump material is reflowed by heating the material above its melting point to form spherical balls or bumps 180. In some applications, bumps 180 are reflowed a second time to improve electrical connection to contact pads 178. The bumps can also be compression bonded to contact pads 178.

Figure 7D:
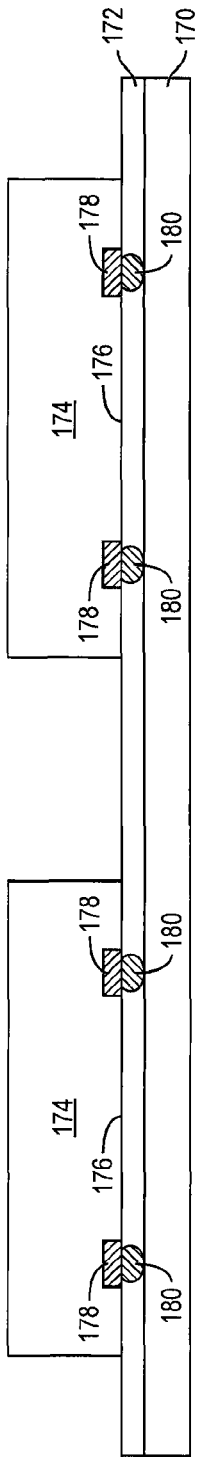

Semiconductor die 174 are aligned and mounted to carrier 170 with a force F applied to back surface 181 to cause bumps 180 to penetrate into slots 173 of adhesive layer 122. The force F is removed after active surface 176 comes into close proximity or touches a top surface of interface layer 172. FIG. 7d shows all semiconductor die 174 mounted to carrier 170 with bumps 180 embedded within slots 173 of adhesive layer 172. The penetrable adhesive layer 172 is cured to harden the adhesive layer and securely hold bumps 180.

Figure 7E:
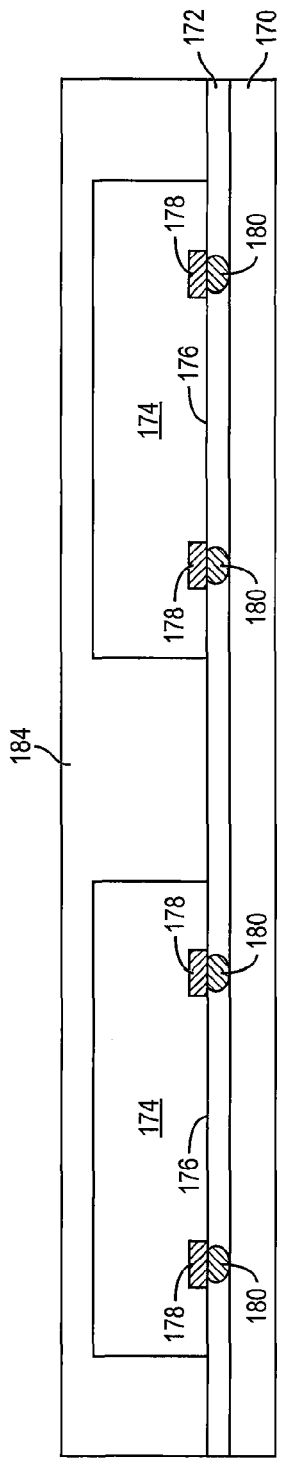

In FIG. 7e, an encapsulant or molding compound 184 is deposited over semiconductor die 174 and carrier 170 using a paste printing, compressive molding, transfer molding, liquid encapsulant molding, vacuum lamination, spin coating, or other suitable applicator. Encapsulant 184 can be polymer composite material, such as epoxy resin with filler, epoxy acrylate with filler, or polymer with proper filler. Encapsulant 184 is non-conductive and environmentally protects the semiconductor device from external elements and contaminants.

With bumps 180 embedded into adhesive layer 172 and the adhesive layer cured, semiconductor die 174 remain stationary during deposition of encapsulant 184. The embedded bumps 180 hold semiconductor die 174 securely in place, reducing lateral or vertical shifting of the die, while encapsulant 184 is deposited and cured. If the Tg of penetrable adhesive layer 172 is less than the Tg of encapsulant 184, then the adhesive layer can be cured simultaneously with the encapsulant.

Figure 7F:
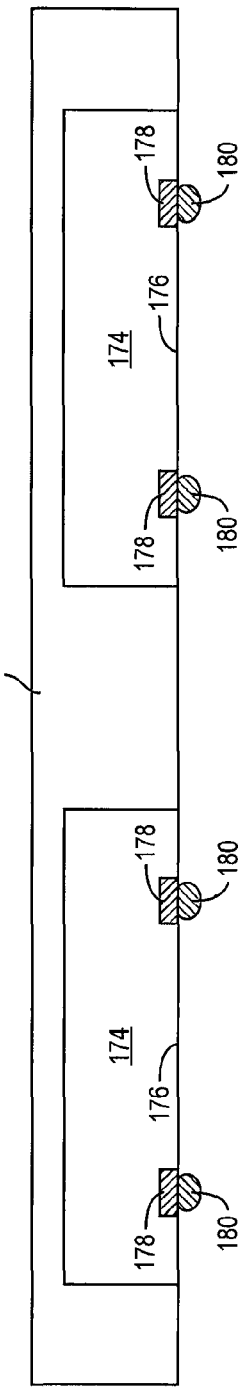

In FIG. 7f, temporary carrier 170 and adhesive layer 172 are removed by chemical etching, mechanical peel-off, CMP, mechanical grinding, thermal bake, UV light, laser scanning, or wet stripping. Bumps 180 are exposed from contact pads 178.

Figure 7G:
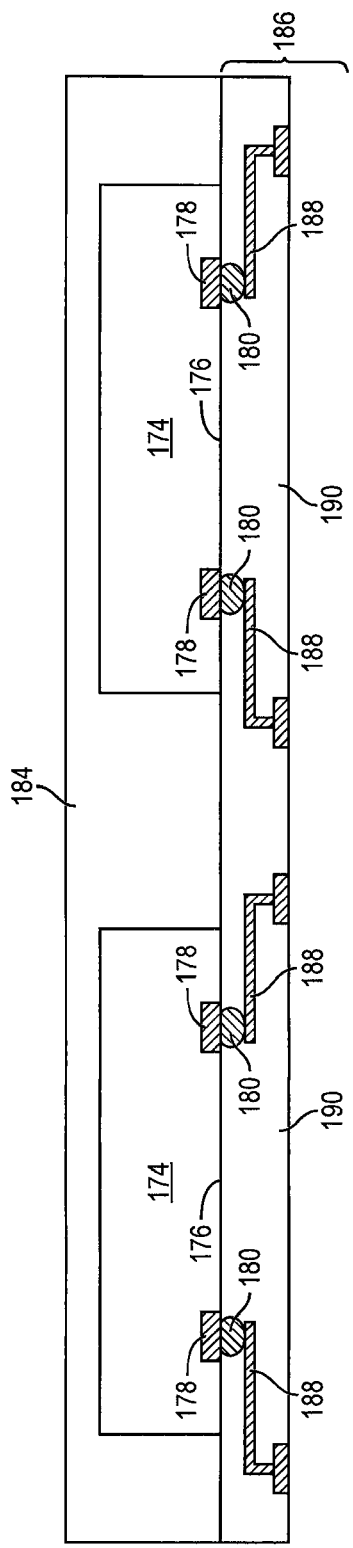

In FIG. 7g, a bottom-side build-up interconnect structure 186 is formed over active surface 176 of semiconductor die 174 and encapsulant 184. The build-up interconnect structure 186 includes an electrically conductive layer 188 formed using a patterning and metal deposition process such as sputtering, electrolytic plating, and electroless plating. Conductive layer 188 can be one or more layers of Al, Cu, Sn, Ni, Au, Ag, or other suitable electrically conductive material. One portion of conductive layer 188 is electrically connected to bumps 180 and contact pads 178 of semiconductor die 174. Other portions of conductive layer 188 can be electrically common or electrically isolated depending on the design and function of the semiconductor device.

The build-up interconnect structure 186 further includes an insulating or passivation layer 190 formed between conductive layers 188 and containing one or more layers of SiO2, Si3N4, SiON, Ta2O5, Al2O3, or other material having similar insulating and structural properties. The insulating layer 190 is formed using PVD, CVD, printing, spin coating, spray coating, sintering or thermal oxidation. Bumps 180 are embedded within insulating layer 190.

Figure 7H:
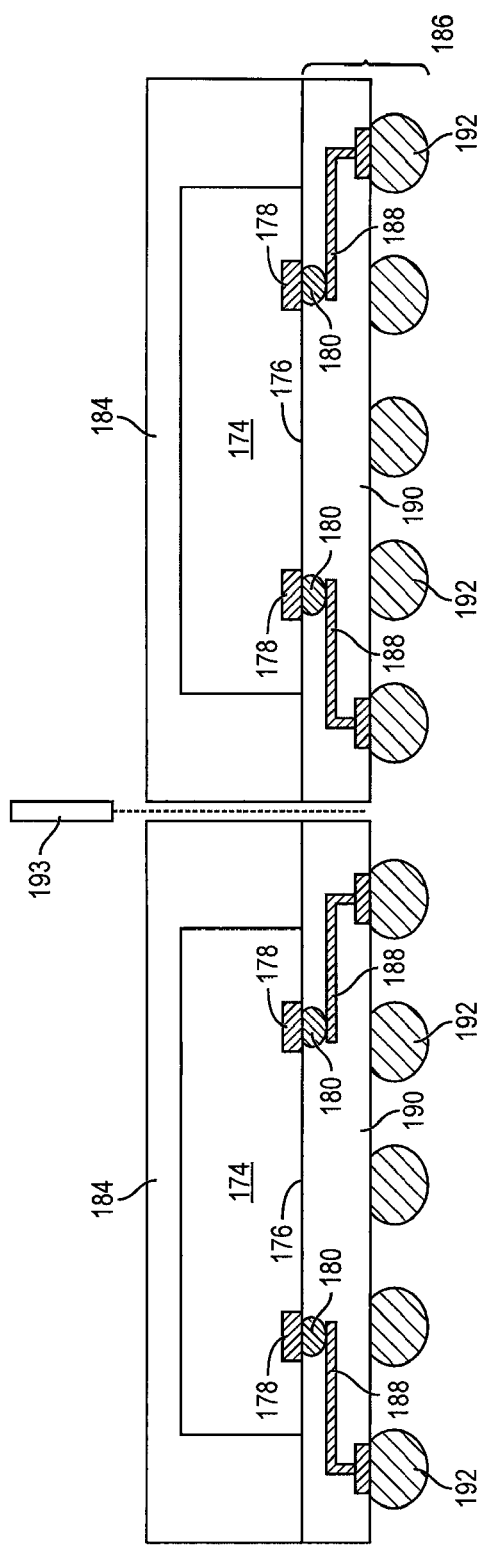

In FIG. 7h, an electrically conductive bump material is deposited over build-up interconnect structure 186 and electrically connected to conductive layer 188 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 188 using a suitable attachment or bonding process. In one embodiment, the bump material is reflowed by heating the material above its melting point to form spherical balls or bumps 192. In some applications, bumps 192 are reflowed a second time to improve electrical contact to conductive layer 188. The bumps can also be compression bonded to conductive layer 188. Bumps 192 represent one type of interconnect structure that can be formed over conductive layer 188. The interconnect structure can also use bond wires, stud bump, micro bump, or other electrical interconnect.

Semiconductor die 174 are singulated with saw blade or laser cutting tool 193 into individual FO-WLCSPs.

Figure 8A:
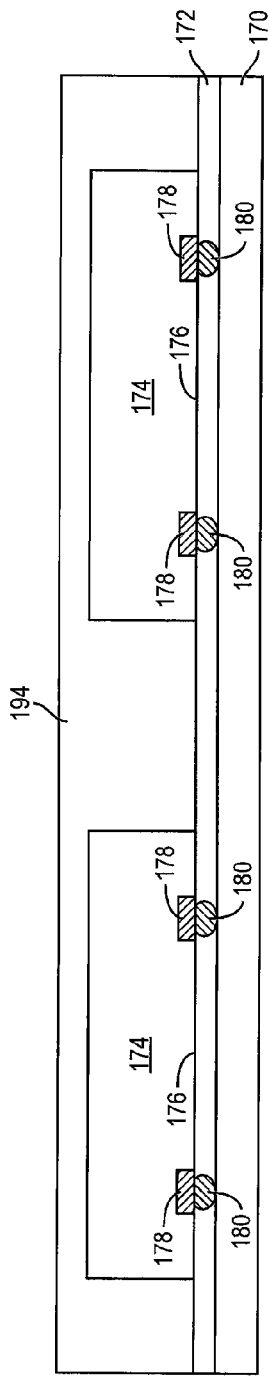
FIGS. 8a-8d illustrate a process of embedding bumps in slots formed in an adhesive layer which remains over the interconnect structure.

In another embodiment, continuing from FIG. 7d, an encapsulant or molding compound 194 is deposited over semiconductor die 174 and carrier 170 using a paste printing, compressive molding, transfer molding, liquid encapsulant molding, vacuum lamination, spin coating, or other suitable applicator, as shown in FIG. 8a. Encapsulant 194 can be polymer composite material, such as epoxy resin with filler, epoxy acrylate with filler, or polymer with proper filler. Encapsulant 194 is non-conductive and environmentally protects the semiconductor device from external elements and contaminants.

Figure 8B:
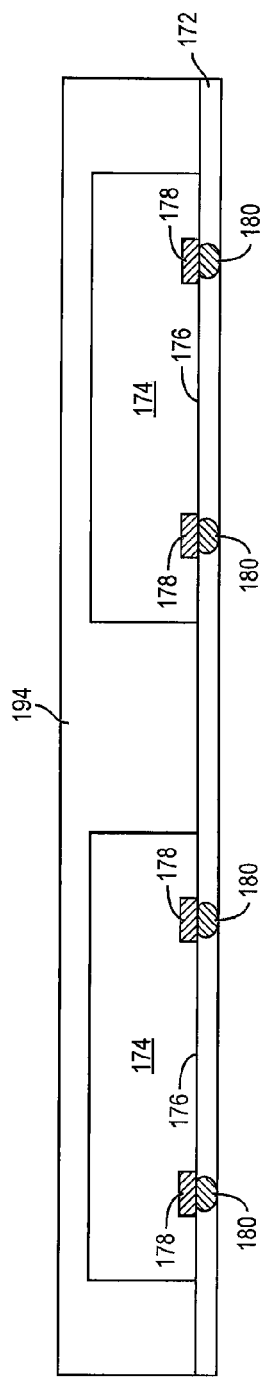

In FIG. 8b, temporary carrier 170 is removed by chemical etching, mechanical peel-off, CMP, mechanical grinding, thermal bake, UV light, laser scanning, or wet stripping. In this case, adhesive layer 172 remains over active surface 176 and bumps 180.

Figure 8C:
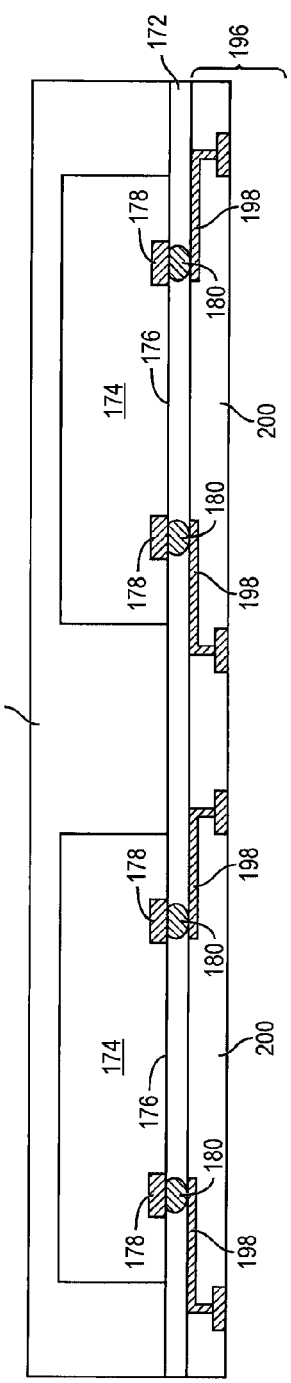

In FIG. 8c, a bottom-side build-up interconnect structure 196 is formed over active surface 176 of semiconductor die 174 and encapsulant 184. The build-up interconnect structure 196 includes an electrically conductive layer 198 formed using a patterning and metal deposition process such as sputtering, electrolytic plating, and electroless plating. Conductive layer 198 can be one or more layers of Al, Cu, Sn, Ni, Au, Ag, or other suitable electrically conductive material. One portion of conductive layer 198 is electrically connected to bumps 180 and contact pads 178 of semiconductor die 174. Other portions of conductive layer 198 can be electrically common or electrically isolated depending on the design and function of the semiconductor device.

The build-up interconnect structure 196 further includes an insulating or passivation layer 200 formed between conductive layers 198 and containing one or more layers of SiO2, Si3N4, SiON, Ta2O5, Al2O3, or other material having similar insulating and structural properties. The insulating layer 200 is formed using PVD, CVD, printing, spin coating, spray coating, sintering or thermal oxidation.

Figure 8D:
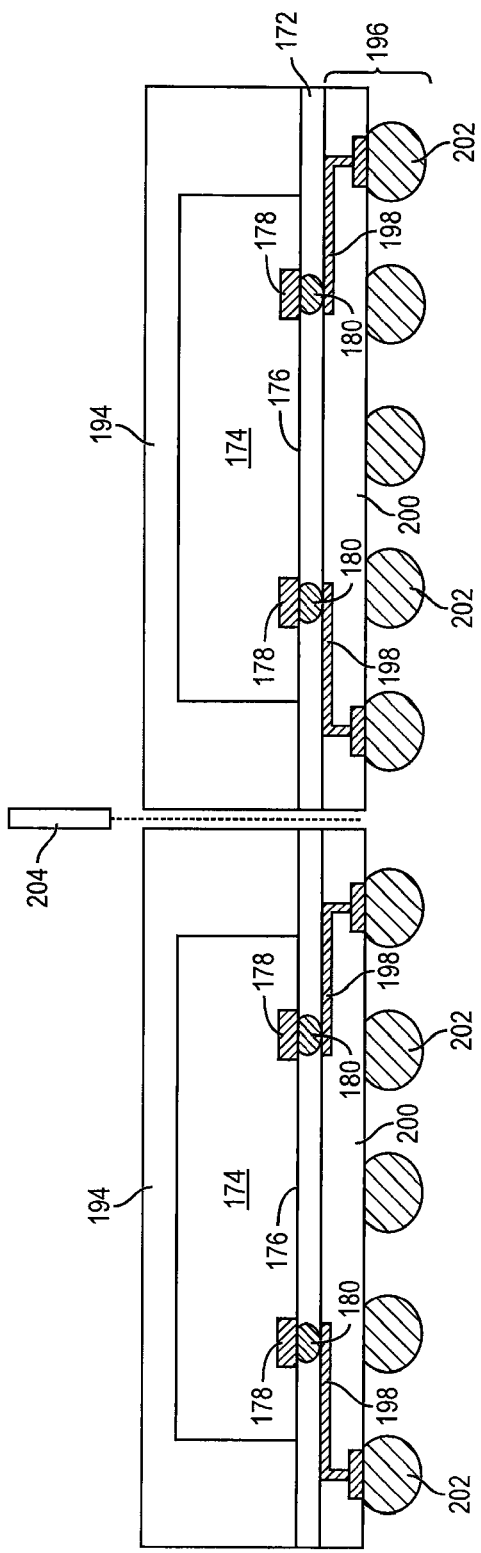

In FIG. 8d, an electrically conductive bump material is deposited over build-up interconnect structure 196 and electrically connected to conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form spherical balls or bumps 202. In some applications, bumps 202 are reflowed a second time to improve electrical contact to conductive layer 198. The bumps can also be compression bonded to conductive layer 198. Bumps 202 represent one type of interconnect structure that can be formed over conductive layer 198. The interconnect structure can also use bond wires, stud bump, micro bump, or other electrical interconnect.

Semiconductor die 174 are singulated with saw blade or laser cutting tool 204 into individual FO-WLCSPs.

Figure 9:
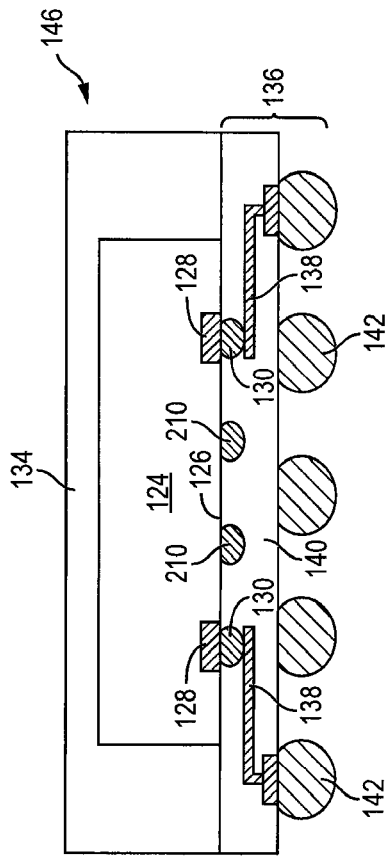
FIG. 9 illustrates the semiconductor die with dummy bumps embedded within the interconnect structure.

FIG. 9 shows an embodiment, continuing from FIG. 4, with a plurality of dummy bumps 210 formed over active surface 126. Dummy bumps 210 are formed at the same time as bumps 130 and penetrate adhesive layer 122, as described in FIG. 3b. The interconnect structure 136 is formed over dummy bumps 210 such that the dummy bumps are embedded within insulating layer 140. Dummy bumps 210 have no electrical connection to the circuits within active surface 126 or to conductive layer 138, but provide additional mechanical interlock strength between semiconductor die 124 and build-up interconnect structure 136.

Figure 10:
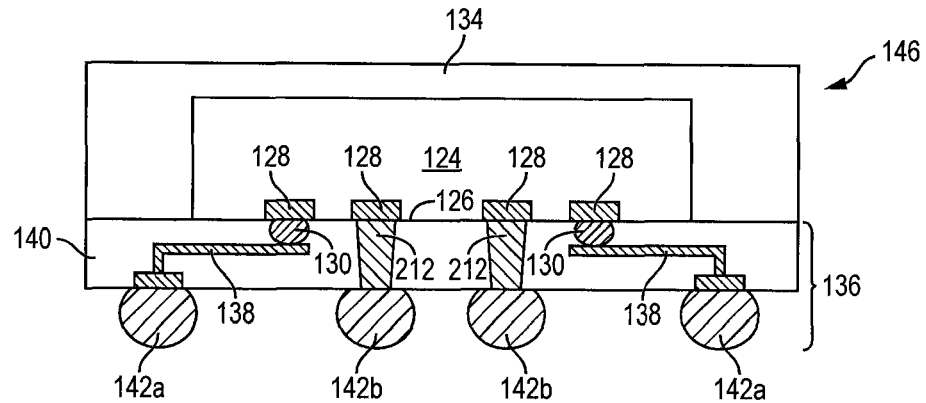
FIG. 10 illustrates the semiconductor die with thermally conductive bumps embedded within the interconnect structure.

FIG. 10 shows an embodiment, continuing from FIG. 4, with a plurality of vias formed through interconnect structure 136. The vias are filled with Al, Cu, or another material with high thermal conductivity to form thermally conductive vias 212. Bumps 142a are electrically connected to conductive layer 138 for power supply and signal transmission. Thermally conductive vias 212 are metallurgically connected to bumps 142b to provide a thermal dissipation path to conduct heat away from semiconductor die 124.

Figure 11:
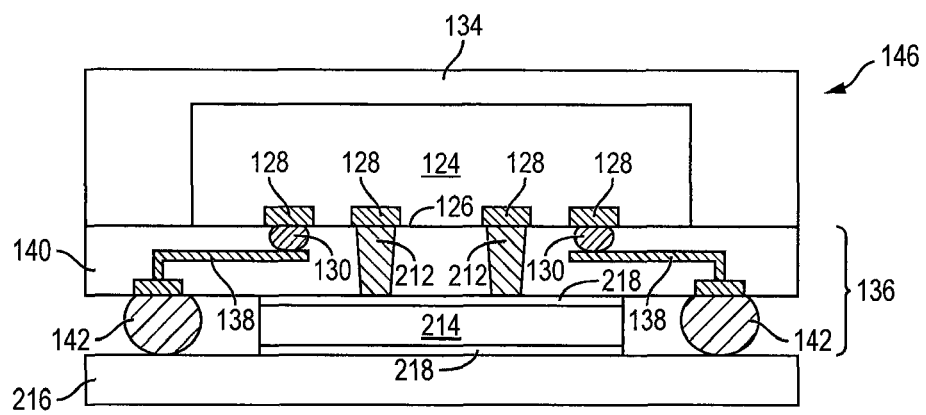
FIG. 11 illustrates the semiconductor die with the thermally conductive bumps and heat sink mounted to the interconnect structure.

FIG. 11 shows an embodiment, continuing from FIG. 10, with a heat sink or heat spreader 214 mounted to build-up interconnect structure 136 and connected to thermally conductive vias 212. PCB 216 is mounted to heat sink 214 and bumps 142. The combination of thermally conductive vias 212, heat sink 214, and PCB 216 provide a thermal dissipation path to conduct heat away from semiconductor die 124. An optional thermal interface material (TIM) 218 can be formed on one or both surfaces of heat sink 214. TIM 218 can be aluminum oxide, zinc oxide, boron nitride, or pulverized silver. TIM 218 aids in the distribution and dissipation of heat generated by semiconductor die 124.

Figure 12:
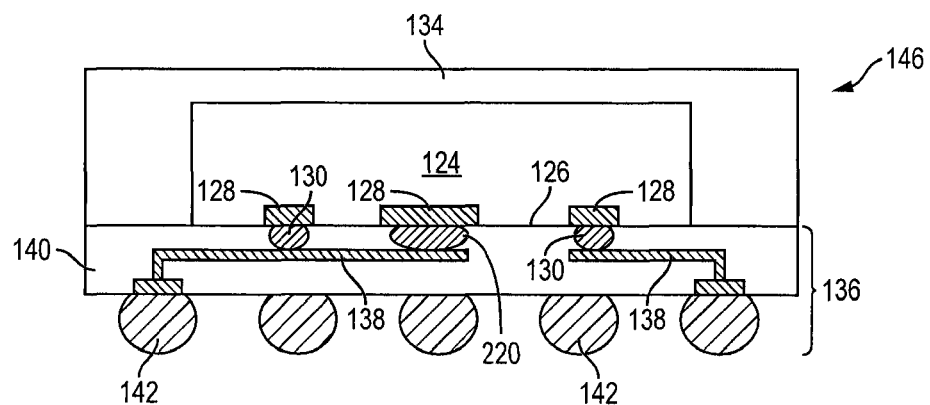
FIG. 12 illustrates the semiconductor die with large bumps embedded within the interconnect structure.

FIG. 12 shows an embodiment, continuing from FIG. 4, with a bump 220 formed over active surface 126. Bump 220 has a cross-sectional area greater than bumps 130 for lower resistance, greater current carrying capacity, and improved electrical performance.

Figure 13:
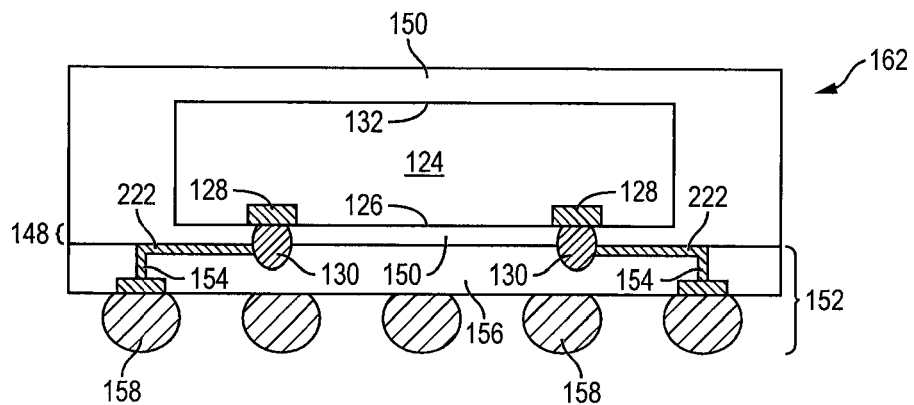
FIG. 13 illustrates the semiconductor die with RDL formed within the interconnect structure.

FIG. 13 shows an embodiment, continuing from FIG. 6, with a redistribution layer (RDL) 222 formed over encapsulant 150 and electrically connected to conductive layer 154 in build-up interconnect structure 152. RDL 222 is electrically connected between bumps 130 and bumps 158.

Figure 14:
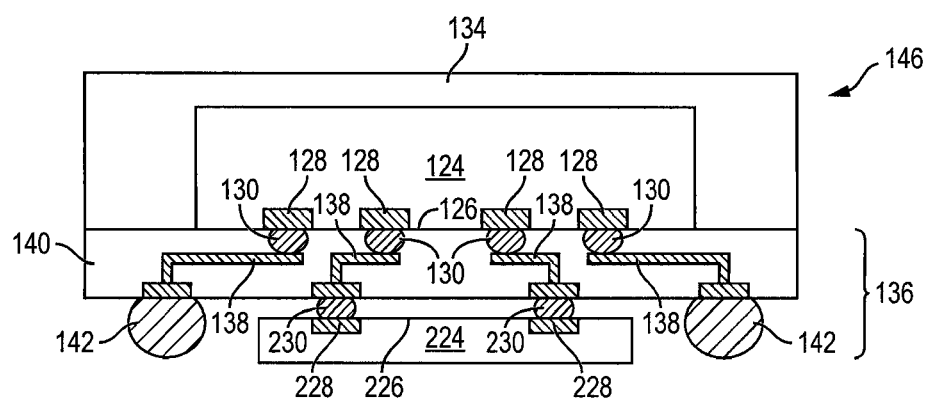
FIG. 14 illustrates a second semiconductor die mounted to the interconnect structure.

FIG. 14 shows an embodiment, continuing from FIG. 4, with semiconductor die 224 having an active surface 226 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 226 to implement analog circuits or digital circuits, such as DSP, ASIC, memory, or other signal processing circuit. Semiconductor die 224 may also contain IPDs, such as inductors, capacitors, and resistors, for RF signal processing. A plurality of contact pads 228 is formed over active surface 226 and electrically connected to the circuits on the active surface. A plurality of bumps 230 are formed over contact pads 228. Semiconductor die 224 is mounted to build-up interconnect structure 136 by electrically connecting bumps 230 to conductive layer 138. A discrete passive or active component can also be mounted to build-up interconnect structure 136.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a first semiconductor die including a plurality of bumps formed on a surface of the first semiconductor die;
a penetrable adhesive layer disposed directly on the surface of the first semiconductor die with the bumps completely embedded within the penetrable adhesive layer to displace the penetrable adhesive layer;
an encapsulant deposited over the first semiconductor die; and
an interconnect structure formed over the first semiconductor die and electrically connected to the bumps.

2. The semiconductor device of claim 1, wherein the bumps completely embedded within the penetrable adhesive layer reduce shifting of the first semiconductor die.

3. The semiconductor device of claim 1, wherein the interconnect structure includes:
a conductive layer; and
an insulating layer formed around the conductive layer.

4. The semiconductor device of claim 1, further including a plurality of electrically isolated bumps formed over the surface of the first semiconductor die.

5. The semiconductor device of claim 1, further including a second semiconductor die or component disposed over a surface of the interconnect structure opposite the first semiconductor die.

6. A semiconductor device, comprising:
a first semiconductor die including a first bump formed over a surface of the first semiconductor die;
an adhesive layer disposed over the first semiconductor die with the first bump embedded within the adhesive layer to displace the adhesive layer; and
an encapsulant deposited over the first semiconductor die.

7. The semiconductor device of claim 6, wherein the first bump embedded within the adhesive layer reduces shifting of the first semiconductor die.

8. The semiconductor device of claim 6, further including an interconnect structure formed over the first semiconductor die and electrically connected to the first bump.

9. The semiconductor device of claim 6, further including a second bump disposed over the semiconductor die, the second bump including a cross-sectional area larger than the first bump.

10. The semiconductor device of claim 6, further including a plurality of openings formed in the adhesive layer.

11. The semiconductor device of claim 8, further including:
a thermally conductive via formed in the interconnect structure; and
a heat sink disposed over a surface of the interconnect structure opposite the first semiconductor die and connected to the thermally conductive via.

12. The semiconductor device of claim 8, further including a second semiconductor die or component disposed over a surface of the interconnect structure opposite the first semiconductor die.

13. A semiconductor device, comprising:
a first semiconductor die including first bumps formed on a surface of the semiconductor die;
an adhesive layer disposed over the first semiconductor die to embed the bumps; and
an encapsulant deposited over the first semiconductor die.

14. The semiconductor device of claim 13, further including a plurality of second bumps formed over the surface of the first semiconductor die and at least partially embedded in the adhesive layer to reduce shifting of the first semiconductor die.

15. The semiconductor device of claim 13, further including an interconnect structure formed over the first semiconductor die.

16. The semiconductor device of claim 13, further including a plurality of openings formed in the adhesive layer.

17. The semiconductor device of claim 15, further including a thermally conductive via formed in the interconnect structure.

18. The semiconductor device of claim 15, further including a heat sink disposed over a surface of the interconnect structure opposite the first semiconductor die.

19. The semiconductor device of claim 15, further including a second semiconductor die or component disposed over a surface of the interconnect structure opposite the first semiconductor die.

20. A semiconductor device, comprising:
a first semiconductor die including bumps formed over a surface of the first semiconductor die;
an adhesive layer disposed over the surface of the first semiconductor die with the bumps at least partially embedded into the adhesive layer to reduce shifting of the first semiconductor die; and
an encapsulant deposited over the first semiconductor die.

21. The semiconductor device of claim 20, further including an interconnect structure formed over the first semiconductor die and electrically connected to the bumps.

22. The semiconductor device of claim 21, further including a thermally conductive via formed in the interconnect structure.

23. The semiconductor device of claim 21, further including a heat sink disposed over a surface of the interconnect structure opposite the first semiconductor die.

24. The semiconductor device of claim 21, further including a second semiconductor die or component disposed over a surface of the interconnect structure opposite the first semiconductor die.

* * * * *